United States Patent [19]
Okada et al.

[11] 4,196,445
[45] Apr. 1, 1980

[54] TIME-BASE ERROR CORRECTION

[75] Inventors: Takashi Okada, Kanagawa; Yasunobu Kuniyoshi; Kiyonori Tominaga, both of Tokyo, all of Japan

[73] Assignee: Sony Corporation, Tokyo, Japan

[21] Appl. No.: 951,881

[22] Filed: Oct. 16, 1978

[30] Foreign Application Priority Data

Oct. 17, 1977 [JP] Japan .................................. 52-12498

[51] Int. Cl.$^2$ .......................... H04N 5/78; H04N 5/79
[52] U.S. Cl. ......................................... 358/8; 360/36
[58] Field of Search ..................... 358/8, 4; 360/36, 38

[56] References Cited

U.S. PATENT DOCUMENTS

| | | | |
|---|---|---|---|
| 3,860,952 | 1/1975 | Tallent et al. | 358/8 |
| 3,909,839 | 9/1975 | Inaba et al. | 358/8 |
| 3,971,063 | 7/1976 | Michael et al. | 358/8 |
| 3,978,519 | 8/1976 | Stalley et al. | 358/8 |
| 4,015,288 | 3/1977 | Ebihara et al. | 358/8 |
| 4,074,307 | 2/1978 | Dischert et al. | 358/8 |

*Primary Examiner*—Daryl W. Cook
*Attorney, Agent, or Firm*—Lewis H. Eslinger; Alvin Sinderbrand

[57] ABSTRACT

In an automatic phase control circuit having a predetermined lock-in range wherein the oscillating signal produced by the adjustable oscillator of the automatic phase control circuit is used in combination with an input signal to derive a signal whose phase is compared to a reference signal, the phase difference between the derived signal and the reference signal being used as a phase control signal for the oscillator so as to minimize this phase difference and thus lock the phase of the derived signal to that of the reference signal, a method of adjusting the oscillator in the event that the phase relation between the oscillating signal and the input signal is outside the lock-in range. During recurrent intervals, which vary with time base errors in the input signal, the number of cycles of the oscillating signal is counted. The count is examined to determine whether it is within a predetermind range of a predetermined count, and if outside this range, the oscillating frequency of the oscillator is adjusted in a direction to return the count to within this predetermined range. In a preferred embodiment, this automatic phase control circuit is used to eliminate time-base errors in at least the chrominance signal of a composite color video signal. In such an embodiment, the adjustable oscillator is used in a frequency-converter for converting the frequency of at least the chrominance signal from an input frequency to a different frequency, and it is the phase of the frequency-converted chrominance signal which is compared to the reference signal.

14 Claims, 33 Drawing Figures

TIME-BASE ERROR CORRECTION

BACKGROUND OF THE INVENTION

This invention relates to a method of and apparatus for controlling an automatic phase control (APC) circuit in the event that this APC circuit is intended to lock the phase of a local oscillating signal to the phase of an input signal which is outside the lock-in range and, more particularly, to the control over such an APC circuit for eliminating time-base errors which are present in, for example, an input color video signal.

Video recording and/or reproducing apparatus is known wherein video signals are recorded on a magnetic tape that is wrapped helically about a portion of the periphery of a guide drum and a pair of diametrically opposed recording transducers, or heads, scan oblique parallel tracks across the tape while the tape is moved longitudinally. In one type of video tape recorder (VTR) for recording composite color video signals, the luminance and chrominance components are separated, processed in different channels, and then recombined to be recorded in the successive, parallel tracks. The luminance signal is frequency modulated onto a relatively higher frequency carrier while the chrominance signal is frequency-converted to a lower frequency band which lies below the frequency-modulated luminance band. Then, the frequency-modulated luminance signal and the frequency-converted chrominance signal are combined for recording.

When composite color video signals are recorded in the aforementioned format, a compatible reproducing device is used to reproduce the video signals and to return them to their original form. Thus, upon reproduction, the frequency-modulated luminance signal is separated from the reproduced composite signal to be frequency demodulated, while the frequency-converted chrominance signal is frequency re-converted back to its original frequency band. The demodulated luminance signal and the frequency reconverted chrominance signal then are recombined to provide the original composite color video signal in standard format, such as the NTSC convention. Because of disturbances which may be introduced into the tape movement, mechanical vibrations or fluctuations in the rotation of the rotary heads, or other factors, time-base errors may be present in the reproduced video signals. Such time-base errors, if not corrected, appear as jitter in the ultimately reproduced video picture. Furthermore, such time-base errors may affect the frequency and/or phase of the reproduced chrominance subcarrier so as to deteriorate the hue of the video picture.

Various techniques have been proposed to eliminate or cancel these time-base errors from the reproduced chrominance signal. In one technique, such as described in U.S. Pat. No. 3,803,347, an automatic frequency control (AFC) circuit is provided to control the frequency of the frequency-converting signal which is used to reconvert the reproduced chrominance signal back to its original frequency band. In this AFC circuit, a voltage controlled oscillator, which is used to produce the frequency converting signal, has its frequency controlled by the horizontal synchronizing signals which are separated from the demodulated luminance component. While this may lock the frequency and phase of the frequency converting signal to that of the horizontal synchronizing signal, this relationship obtains only at the time of occurrence of each horizontal synchronizing signal. Consequently, time-base errors are compensated only during the beginning of each horizontal line interval, but such errors will not be compensated during the remainder of each line interval.

In another proposal, as described in U.S. Pat. No. 2,921,976, an automatic phase control (APC) circuit is provided to compensate for time-base errors which may be present in the reproduced burst signal to a different degree than are present in the reproduced horizontal synchronizing signal. In this APC circuit, the phase of the frequency converting signal is locked to the phase of the burst signal which is extracted from the reconverted chrominance signal. It is thought that by synchronizing the phase of the frequency converting signal to that of the reproduced burst signal, time-base errors which are present in the chrominance subcarrier, and which are assumed to be equal to the time-base errors in the burst signal, can be eliminated. However, the APC circuit has a predetermined lock-in range. Time-base errors which are outside this lock-in range, such as those errors which appears as a sudden change known as skew jitter, exhibit large time-base errors which are beyond the lock-in range of the APC circuit and, therefore, cannot be eliminated immediately by the APC circuit.

A still further proposal for correcting time-base errors is described in U.S. Pat. No. 3,723,638. In this proposal, a combination automatic frequency and phase control (AFPC) circuit is provided to lock the phase of the frequency converting signal to the reproduced burst signal and also to synchronize the frequency of this frequency converting signal with the reproduced horizontal synchronizing signal. This phase and frequency control are performed simultaneously. However, there are occasions when the phase control over the frequency converting signal tends to achieve a contrary change than the frequency control over this signal. That is, the time-base errors in the burst signal may require a change in the phase of the frequency converting signal in one direction in order to eliminate such errors, while at the very same time, the time-base errors in the horizontal synchronizing signal may require an opposite change in the frequency converting signal for time-base error correction. As a result thereof, the time-base errors are not satisfactorily eliminated.

One solution to the foregoing problem is described in copending U.S. application Ser. No. 851,408, filed Nov. 14, 1977. In that application, time-base errors in the chrominance signal are corrected by an APC circuit. In the event that such time-base errors are outside the lock-in range of the APC circuit, an AFC circuit is operated to provide additional control, and thus bring the APC circuit into its lock-in range. In one embodiment of the apparatus disclosed in that application, the oscillating signal produced by a voltage controlled oscillator is used to produce the frequency reconverting signal by which the chrominance signal is reconverted back to its original frequency band. The frequency of this oscillating signal is divided to a frequency equal to $(n+k)f_H$, wherein $f_H$ is the horizontal synchronizing frequency. This divided frequency then is sampled by the horizontal synchronizing frequency. In accordance with sampling theory, the sampled signal will have a frequency $kf_H$. Thus, as the frequency of the voltage controlled oscillator varies in order to track the time-base errors in the reproduced burst signal, the frequency of the sampled signal will fluctuate from the predetermined frequency $kf_H$. This frequency fluctuation is detected and, when it exceeds a predetermined amount, that is, when the time-base errors between the horizontal synchronizing signal and the voltage controlled oscillating signal exceed the lock-in range, this detected frequency fluctuation is used to derive a control signal for adjusting the frequency of the voltage controlled oscillator. Some of the circuitry which is used to carry out this technique, and particularly the frequency detecting circuit, is constructed of inductance and capacitance elements which generally are not fabricated as an integrated circuit. Hence, additional assembly steps are needed in order to provide this frequency detector in the time-base error correcting circuit. It is preferred to carry out the teachings of the aforementioned application in accordance with integrated circuit fabrication.

The present invention is directed to another embodiment of time-base error correcting apparatus of the type described in the above-mentioned copending application, which apparatus employs digital circuitry which, advantageously, is formed as an integrated circuit.

OBJECTS OF THE INVENTION

Therefore, it is an object of the present invention to provide an improved time-base error correcting circuit which overcomes the problems of the prior art and which, advantageously, is fabricated in accordance with integrated circuit technology.

Another object of this invention is to provide time-base error correcting apparatus wherein an automatic phase control circuit is used to eliminate time-base errors which are within the lock-in range of the circuit, and wherein an automatic frequency control operation is carried out in the event that the time-base errors are outside this lock-in range.

A further object of this invention is to provide time-base error correcting apparatus for use in correcting time-base errors from the chrominance signal of a composite color video signal wherein both phase and frequency errors are eliminated rapidly and reliably.

An additional object of this invention is to provide a method for adjusting the controllable oscillator in an automatic phase control circuit in the event that the automatic phase control circuit is used to follow phase and/or frequency variations, or time-base errors, in a signal, which variations or errors are outside the lock-in range of the automatic phase control circuit.

Various other objects, advantages and features of the present invention will become readily apparent from the ensuing detailed description, and the novel features will be particularly pointed out in the appended claims.

SUMMARY OF THE INVENTION

In accordance with this invention, an adjustable oscillator, which is provided in an automatic phase control circuit having a predetermined lock-in range, is controlled in the event that the phase relation between the oscillating signal derived from the oscillator and an input signal, to whose phase the oscillating signal is to be synchronized, is outside the lock-in range. The number of cycles of the oscillating signal which are produced during recurrent intervals are counted; these intervals having durations which vary with the time-base errors in the input signal. The count attained at the end of each interval is sensed as being either within a predetermined range of a predetermined count or outside this range. In the event that the count is outside this range, due to the time-base errors exceeding the lock-in range of the automatic phase control circuit, the oscillating frequency of the oscillator is adjusted in a direction to return the count to within this predetermined range. In a preferred embodiment, the automatic phase control circuit is used in a time-base error corrector for the chrominance signal of a composite color video signal. In such an application, the adjustable oscillator is included in a frequency-converter which functions to convert the frequency of the chrominance signal from an input frequency to a different frequency. The phase differential between the chrominance signal of converted frequency and a reference signal is used to control the phase of the adjustable oscillator. The recurrent intervals during which the cycles of the oscillating signal are counted are derived from the horizontal synchronizing signal, whereby the duration of each interval varies with time-base errors in the horizontal synchronizing signal. Thus, if the time-base errors are outside the lock-in range, these intervals will be too wide or too narrow, as measured by the number of cycles of the oscillating signal which are counted. Then, the frequency of the adjustable oscillator is varied in a direction to compensate for such time-base errors.

BRIEF DESCRIPTION OF THE DRAWINGS

The following detailed description, given by way of example, will best be understood in conjunction with the accompanying drawings in which.

DETAILED DESCRIPTION OF A PREFERRED EMBODIMENT

Figure 1:
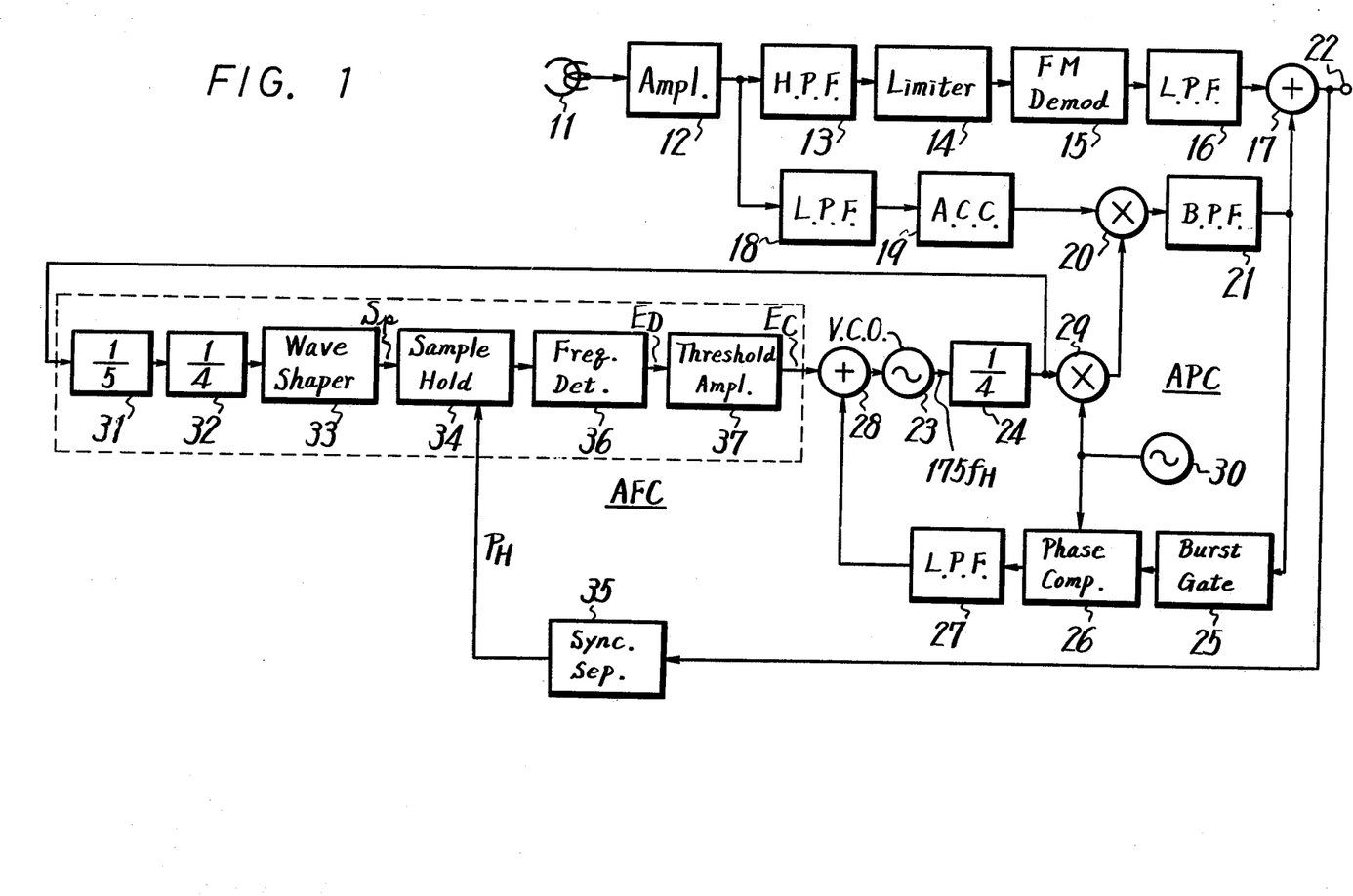
FIG. 1 is a block diagram of time-base error correcting apparatus of the type described in the aforementioned copending application.

Before describing the present invention, reference is made to FIG. 1 which is a block diagram of apparatus for reproducing a composite color video signal from, for example, magnetic tape, this apparatus including a time-base error correcting circuit of the type described in the aforementioned copending application. In the interest of brevity, FIG. 1 illustrates only a portion of the video signal reproducing circuitry which, for example, may be included in a video tape recorder (VTR). As should be readily appreciated, such a VTR also may include video signal recording circuitry, and suitable change-over switches for selecting either a signal recording mode or a signal reproducing mode of operation. It is assumed that the composite color video signals which are reproduced by the illustrated apparatus are recorded in the mode wherein the luminance signal, which includes the horizontal synchronizing signal, is frequency modulated onto a relatively higher carrier while the chrominance signal is frequency-converted down to a frequency band which is lower than the frequency-modulated luminance band. These signals of different band width are combined and recorded in parallel, oblique tracks across a magnetic tape.

The illustrated signal reproducing apparatus includes a playback head 11, an amplifier 12 and separate luminance and chrominance processing channels. The luminance processing channel includes a high-pass filter 13 connected to amplifier 12 for receiving the reproduced composite color video signal and for separating the frequency modulated luminance signal, which is disposed in the higher frequency band, therefrom. The output of high-pass filter 13 is connected through a limiter 14 to an FM demodulator 15. The purpose of limiter 14 is to remove amplitude modulations, or fluctuations, in the separated frequency modulated luminance signal. FM demodulator 15 then demodulates the luminance signal from the amplitude-limited, frequency modulated signal supplied thereto. Undesired higher frequency signals which may accompany the demodulated luminance signal are separated therefrom by low-pass filter 16, and the resultant luminance signal is supplied to a mixing circuit 17 whereat it is combined with the recovered chrominance component and supplied to an output terminal 22.

The chrominance channel includes a low-pass filter 18, an automatic chrominance control circuit 19, a frequency converter 20 and a band pass filter 21, all connected in cascade to the output of amplifier 12. The purpose of low-pass filter 18 is to separate the frequency-converted chrominance signal from the reproduced composite color video signal which, of course, occupies a lower frequency band than the frequency modulated luminance signal. Automatic chrominance control circuit 19 is adapted to compensate for fluctuating levels in the reproduced chrominance signal. Automatic chrominance control circuits are well known and need not be described further. Frequency converter 20 may comprise a heterodyning circuit for mixing the reproduced frequency-converted chrominance signal with a frequency re-converting signal so as to reconvert the chrominance signal back to its original frequency band. Undesired signals which may accompany the frequency re-converted chrominance signal are separated by band pass filter 21. The resultant frequency re-converted chrominance signal is supplied to mixing circuit 17 whereat it is combined with the demodulated luminance signal and supplied as a composite color video signal to output terminal 22.

The frequency re-converting signal which is supplied to frequency converter 20 is produced by heterodyning a reference signal of frequency $f_S$, equal to the original subcarrier frequency of, for example, 3.58 MHz in the NTSC system, with an oscillating signal of frequency $f_a$, for example, a frequency equal to 688 KHz, the frequency of the reproduced frequency-converted chrominance signal. This combination of frequencies is achieved by a frequency converter 29 which is supplied with the reference signal from a reference oscillator 30 and with the oscillating signal derived from an adjustable oscillator 23, which may be a voltage-controlled oscillator, and a frequency divider 24. The reference signal and oscillating signal are heterodyned in frequency converter 29 so as to produce a frequency re-converting signal whose frequency is equal to the sum of the frequencies of the reference and oscillating signals ($f_S+f_a$). When this frequency re-converting signal is heterodyned with the reproduced frequency-converted chrominance signal in frequency converter 20, it is appreciated that this frequency converter produces heterodyned signals whose frequencies are equal to the sum and difference of the frequencies supplied to frequency converter 20. The frequency converter includes suitable circuitry for selecting the difference frequency, with the result that the output of frequency converter 20 is the frequency re-converted chrominance signal whose frequency is equal to $f_S+F_a-f_a=f_S$. Thus, the original subcarrier frequency is restored.

It is preferred that the frequency-converted chrominance subcarrier frequency be equal to $(44\frac{1}{4}) f_H$, in which $f_H$ is the horizontal synchronizing frequency of 15.75 KHz, or 688 KHz. To this effect, the center frequency of adjustable oscillator 23 is equal to 175 $f_H$, and the oscillating signal produced by this adjustable oscillator is frequency divided by frequency divider 24 by a factor of one-fourth. Thus, the frequency of the oscillating signal produced at the output of frequency divider 24 is equal to $(175/4) f_H$, of $(44\frac{1}{4}) f_H$.

In the event of time-base errors, the reproduced chrominance subcarrier may fluctuate in frequency and/or phase from its desired frequency of 688 KHz. In order to eliminate these time-base errors, the frequency and phase of the oscillating signal which is heterodyned with the reference signal to produce the frequency re-converting signal should be synchronized with the reproduced chrominance subcarrier. Accordingly, an automatic phase control (APC) circuit is provided to synchronize adjustable oscillator 23 with the reproduced chrominance subcarrier. This APC circuit is comprised of a burst gate 25, a phase comparator 26 and a low-pass filter 27. Burst gate 25 is connected to the output of band-pass filter 21 and functions to separate the burst signal from the frequency re-converted chrominance signal. Since the structure and operation of burst gates are known to those of ordinary skill in the art, further description thereof is not provided. The output of burst gate 25 is connected to one input of phase comparator 26, the other input of which being connected to reference oscillator 30. The phase comparator is operative to detect any phase differential between the reference signal generated by reference oscillator 30 and the frequency re-converted burst signal which is separated from the frequency re-converted chrominance signal. It may be appreciated that if the time-base errors in the reproduced chrominance signal are eliminated, the phase of the burst signal which is separated from the frequency re-converted chrominance signal will be equal to the phase of the reference signal. However, any phase differential between these signals is indicative of the uncorrected time-base error in the chrominance signal. Hence, phase comparator 26 produces an error signal, or phase control signal, as a function of this phase differential, this phase control signal being filtered by low-pass filter 27 and supplied to adjustable oscillator 23 via a mixing circuit 28. Thus, the oscillating signal which is derived from adjustable oscillator 23 is controlled in a manner so as to eliminate, or substantially minimize, small time-base errors, such as phase errors, included in the reproduced chrominance signal.

The apparatus illustrated in FIG. 1 also includes an automatic frequency control (AFC) circuit which, as will be described below, and as described in greater detail in the aforementioned copending application, is operative to control adjustable oscillator 23 in the event that the time-base errors in the reproduced video signal are outside the lock-in range of the APC circuit. This AFC circuit is comprised of frequency dividers 31 and 32, connected in cascade to the output of frequency divider 24, and adapted to divide the frequency of the oscillating signal supplied thereto by factors of one-fifth and one-fourth, respectively. The output of frequency divider 32 is connected to a wave shaper 33 which is adapted to generate a sawtooth waveform having a frequency equal to the frequency of the signal supplied thereto by frequency divider 32. This sawtooth waveform is connected to one input of a sample-and-hold circuit 34. The other input of this sample-and-hold circuit is connected to receive sampling pulses which are synchronized with the horizontal synchronizing signal included in the reproduced composite color video signal. To this effect, a synchronizing signal separator 35 is connected to the output of mixing circuit 17 to separate the horizontal synchronizing pulses from the re-formed video signal and to supply these separated horizontal synchronizing pulses to the sample-and-hold circuit as sampling pulses therefor. The output of sample-and-hold circuit 34 is connected to a frequency detector 36 which is adapted to produce an output voltage which is proportional to the frequency of the signal supplied thereto. This output voltage is supplied to a threshold amplifier 37, the latter being operative to function as a so-called coring circuit for producing a voltage proportional to the frequency of the signal supplied thereto only if that frequency lies outside a predetermined range, or window. The output of threshold amplifier 37 is connected through mixing circuit 38 to adjustable oscillator 23.

Figure 2:
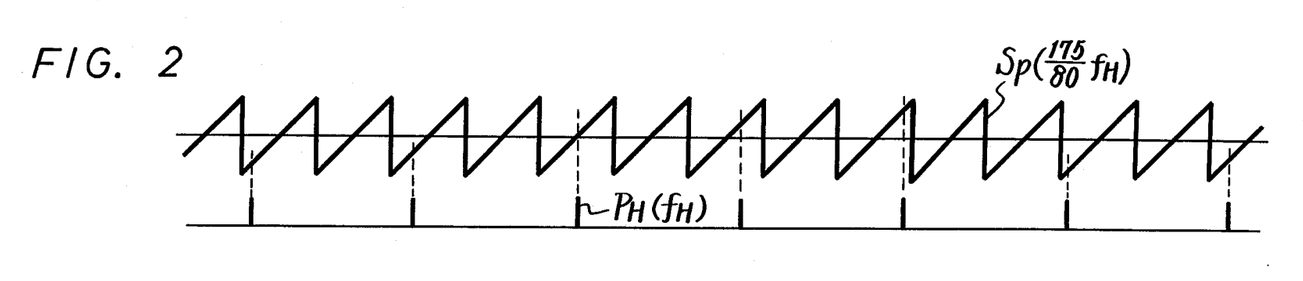
FIG. 2 is a waveform diagram of the signals which are supplied to the sample-and-hold circuit of the illustrated time-base error correcting apparatus.
Figures 3, 4:
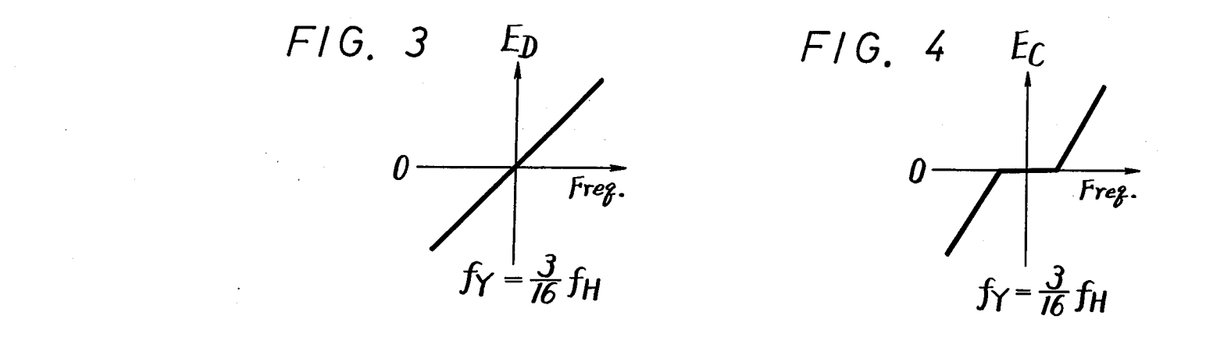
FIGS. 3 and 4 are graphical representations of the operating characteristics of the frequency detector and threshold amplifier, respectively, included in the apparatus illustrated in FIG. 1.

The operation of the illustrated AFC circuit now will be briefly described with reference to the waveforms shown in FIG. 2 and with reference to the voltage-frequency characteristics shown in FIGS. 3 and 4. It is appreciated that the frequency of the oscillating signal generated by adjustable oscillator 23 is divided in frequency divider 24 by a factor of four, in frequency divider 31 by a factor of five and in frequency divider 32 by a factor of four. Hence, the frequency of the frequency-divided oscillating signal produced at the output of frequency divider 32 is equal to (175/80) $f_H$. Wave shaper 33 generates a sawtooth waveform $S_p$ of equal frequency, as shown in FIG. 2. This sawtooth waveform is supplied to sample-and-hold circuit 34 together with sampling pulses $P_H$ which, it is recalled, have a frequency $f_H$ equal to the horizontal synchronizing frequency. The signal sampled by sample-and-hold circuit 34 will have a frequency corresponding to the beat frequency between the sawtooth waveform $S_p$ and the sampling pulses $P_H$. The frequency of of the sawtooth waveform 175/80 $f_H$ may be rewritten as $(2+3/16) f_H$. In accordance with sampling theory, if a signal having a frequency $kf_H$, or $(1\pm k) f_H$, or $(2\pm k) f_H$, . . . , or $(n\pm k) f_H$ is sampled by a sampling signal having the frequency $f_H$, the sampled signal will have a frequency $kf_H$ in all cases. In the above expression for the frequency of the sawtooth waveform, it is seen that $k=3/16$. Thus, when the frequency of the oscillating signal generated by adjustable oscillator 23 is exactly equal to 175 $f_H$, and when the frequency of the reproduced horizontal synchronizing pulses is exactly equal to $f_H$, the output of sample-and-hold circuit will have a frequency equal to 3/16 $f_H$. Of course, if the frequency of the oscillating signal generated by adjustable oscillator 23 changes, or if, because of time-base errors, the frequency of the reproduced horizontal synchronizing signal changes, then a corresponding change is imparted into the frequency of the sampled signal produced at the output of sample-and-hold circuit 34.

The sampled signal produced by the sample-and-hold circuit is discriminated by frequency detector 36. The frequency characteristic of the frequency detector is illustrated in FIG. 3. When the frequency of the signal supplied to the frequency detector is equal to its predetermined center frequency of 3/16 $f_H$, a zero output voltage is produced thereby. As the frequency of the sampled signal supplied to the frequency detector increases, the output voltage thereof correspondingly increases in a proportional manner. Conversely, if the frequency of the sampled signal supplied to frequency detector 36 decreases below the center frequency 3/16 $f_H$, the output voltage produced thereby increases in the negative direction. This detected voltage $E_D$, which is a DC voltage produced by frequency detector 36, is supplied to threshold amplifier 37.

Threshold amplifier 25 may include a coring circuit so that the output signal therefrom is cored, that is, the output signal from threshold amplifier 25 is zero provided the detected voltage $E_D$ supplied thereto from frequency detector 36 lies within a predetermined range, or window. When an upper threshold level is exceeded by the detected voltage $E_D$, a proportional correcting voltage $E_C$ is produced by the threshold amplifier and is supplied through mixing circuit 28 to adjustable oscillator 23. Similarly, when a lower, or negative, threshold level is exceeded by the detected voltage $E_D$, the correcting voltage $E_C$ produced by threshold amplifier 37 is proportional thereto. Since the detected voltage $E_D$ produced by frequency detector 36 is proportional to the frequency of the sampled signal supplied thereto by sample-and-hold circuit 34, the correcting voltage $E_C$ produced by threshold amplifier 37 may be thought of as being related to the frequency of this sampled signal. FIG. 4 is a graphical representation of the voltage-frequency characteristic of the threshold amplifier. The range over which the correcting voltage $E_C$ remains equal to zero is determined as a function of the lock-in range of the APC circuit. That is, threshold amplifier 37 provides a zero output to adjustable oscillator 23 only so long as this oscillator can be locked-in by the operation of phase comparator 26. When the detected time-base error exceeds the lock-in range of the APC circuit, the correcting voltage $E_C$ is either a positive or negative level, depending upon this time-base error, and is supplied to control the frequency of adjustable oscillator 23. Thus, as soon as the time-base error in the reproduced chrominance signal exceeds the lock-in range of the APC circuit, the AFC circuit becomes operative to supply a suitable correcting voltage $E_C$ to adjustable oscillator 23 for immediately adjusting the frequency thereof so as to return to the lock-in range. Consequently, the large time-base errors can be corrected. Of course, since both the APC and the AFC circuits do not operate when the time-base errors are within the lock-in range, the possible problem of contrary control over adjustable oscillator 23 by these respective circuits is avoided.

Unfortunately, the AFC circuit shown within the broken lines of FIG. 1, cannot be manufactured readily as an ingegrated circuit. This is because, in order to attain the voltage-frequency characteristic shown in FIG. 3, frequency detector 36 preferably includes an inductance element. The use of an inductance element requires an external connection to an integrated circuit. This is avoided in accordance with the embodiment of the present invention shown in FIG. 5 wherein the AFC circuit can be fully constructed as an integrated circuit. Moreover, in the embodiment shown in FIG. 5, digital techniques are incorporated into the AFC circuit. As is recognized, the luminance and chrominance channels of the reproducing apparatus shown in FIG. 5, as well as the illustrated APC circuit, are identical to the corresponding luminance and chrominance channels, and to the APC circuit shown in FIG. 1. Hence, further description of these circuits is not provided. The illustrated AFC circuit is comprised of a recyclical counter 44, logic circuits 49 and 50, a current converter 51 and an integrating circuit 56. The purpose of recyclical counter 44 is to count the number of cycles, or pulse signals, produced by adjustable oscillator 23 during recurrent intervals, the latter being related to the horizontal synchronizing period. Recyclical counter 44 is comprised of a count-to-five counter 45, a count-to-seven counter 46 and a count-to-two counter 47, these counters being connected in cascade. As is clear to one of ordinary skill in the art, counters 45, 46 and 47 may be frequency dividers which are adapted to divide the frequency of the pulse signals supplied thereto by factors of five, seven and two, respectively. These counters, or frequency dividers, will be described in greater detail below with respect to FIG. 8. Each of these counters, or frequency dividers, is provided with a reset input connected to receive a reset pulse generated by a NAND gate 48. An AND gate 41 has one input connected to adjustable oscillator 23 to receive the oscillating pulses generated thereby and another input connected to receive an enabling signal, this enabling signal being produced during the aforementioned interval. The output of AND gate 41 supplies pulses having a frequency equal to the frequency of adjustable oscillator 23 to recyclical counter 44 for the duration of the enabling signal, to be described.

Figure 8:
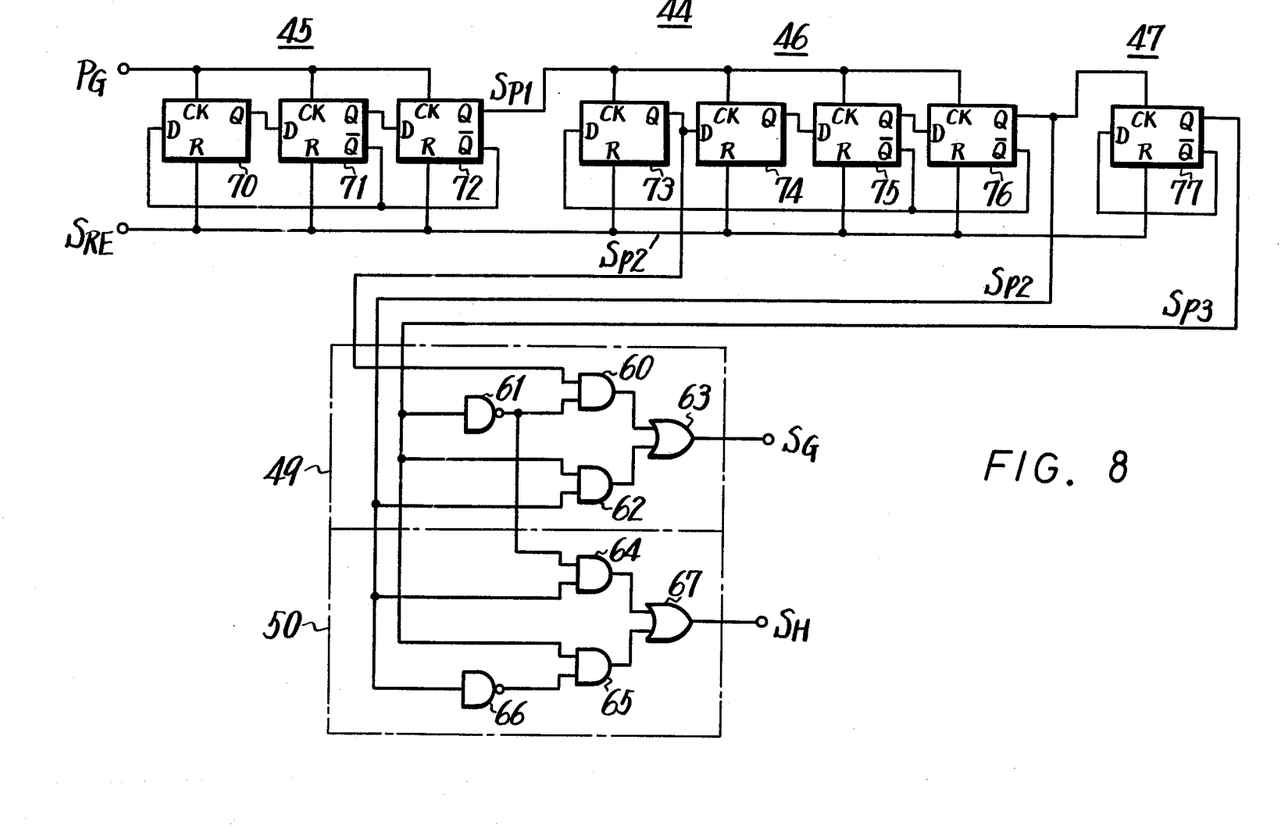
FIG. 8 is a logic diagram of a portion of the apparatus shown in FIG. 5.

Logic circuit 49 is connected to each of counters, or frequency dividers, 45, 46 and 47 and is adapted to produce an output signal when the cumulative count of recyclical counter 44 is within a first predetermined range. For example, and as will be described below, logic circuit 49, which is formed of gating circuits shown in greater detail in FIG. 8, is adapted to produce an output signal of a relatively higher voltage level, referred to herein as a binary "1," when the cumulative count of counter 44 is between the counts of three and thirty-two, inclusive. Logic circuit 50 is adapted to perform a similar function as logic circuit 49 and also is formed of gating circuits shown in detail in FIG. 8. Logic circuit 50 is operative to produce an output signal represented as a binary "1" when the cumulative count of counter 44 is between the counts of thirty-three and sixty-seven, inclusive. Thus, when counter 44, which is capable of counting from zero to seventy and then recycling, exhibits a count of sixty-eight, sixty-nine, zero (which corresponds to seventy), one, or two, neither logic circuit 49 nor logic circuit 50 produces a binary "1."

Figure 5:
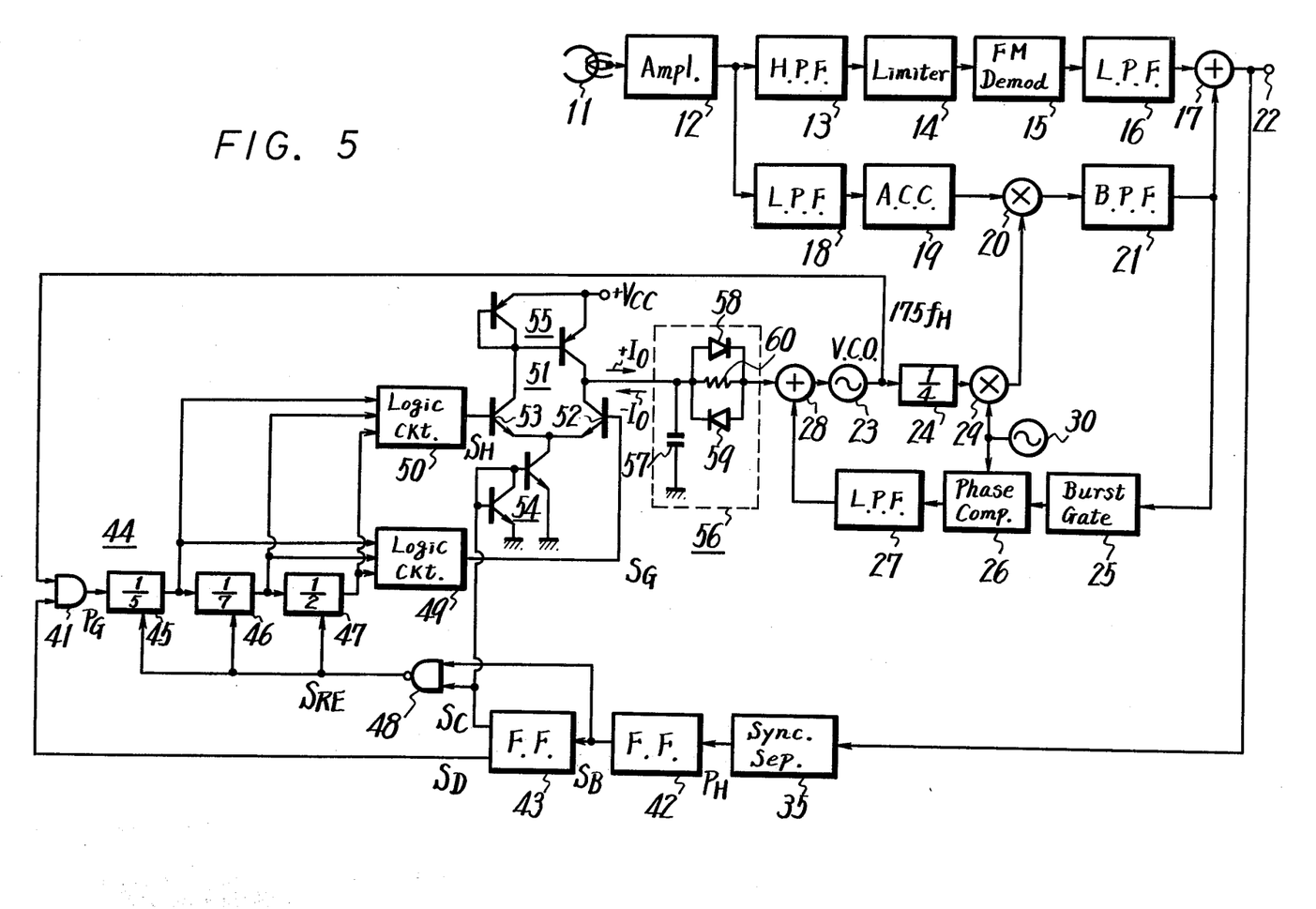
FIG. 5 is a partial block, partial schematic diagram of time-base error correcting apparatus in accordance with the present invention.

Current converter 51 is connected to logic circuits 49 and 50 and is adapted to supply a charging or discharge current to integrating circuit 56 depending upon which of the logic circuits produces a binary "1." The current converter includes a pair of transistors, shown as NPN-type transistor 52 and 53, having their emitter electrodes connected in common to a current source 54. The collector electrode of transistor 53 is connected to a current-mirror circuit 55, the output of this current-mirror circuit being coupled to integrating circuit 56. The collector electrode of transistor 52 is connected directly to integrating circuit 56. The base electrodes of transistors 52 and 53 are connected to logic circuits 49 and 50, respectively. Integrating circuit 56 is comprised of a capacitor 57 adapted to be charged or discharged in accordance with the operation of current converter 51. The integrating circuit additionally includes a pair of oppositely-poled diodes 58 and 59 connected in parallel with a resistor 60, this circuit being connected between capacitor 57 and mixing circuit 28. Resistor 50 is of a relatively high resistance, and diodes 58 and 59 tend to limit the magnitude of the voltage supplied to the mixing circuit from capacitor 57.

The AFC circuit additionally includes a divide-by-four circuit comprised of triggerable flip-flop circuits 42 and 43 connected in cascade. The first stage flip-flop circuit 42 receives the horizontal synchronizing pulses $P_H$ which are separated from the reproduced composite color video signal by synchronizing signal separator circuit 35. As is recognized, the frequency of the separated horizontal synchronizing pulses $P_H$ is divided by a factor of two by flip-flop circuit 42. The output of this flip-flop circuit is connected to the second stage flip-flop circuit 43 which, in turn, is adapted to provide an additional dividing factor of two. Flip-flop circuit 43 includes a pair of output terminals whereat complementary signals are provided, the frequency of each of these complementary signals being equal to one-fourth the horizontal synchronizing frequency. One of these output signals $S_D$ is utilized as the enabling signal to enable the operation of AND gate 41. The complement of this signal $S_C$ is supplied to one input of NAND gate 48, and the output $S_B$ of flip-flop circuit 42 is connected to the other input of this NAND gate. In addition, the complementary output signal $S_C$ is supplied to current source 54 as an adjustment pulse, whereby the operation of current converter 51 is enabled.

Figure 6A:
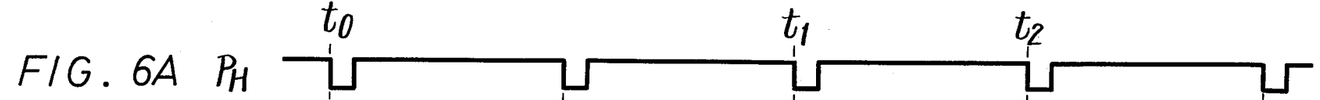
FIGS. 6A–6I are waveform diagrams which are useful in understanding the operation of the apparatus shown in FIG. 5.
Figures 6B, 6C:
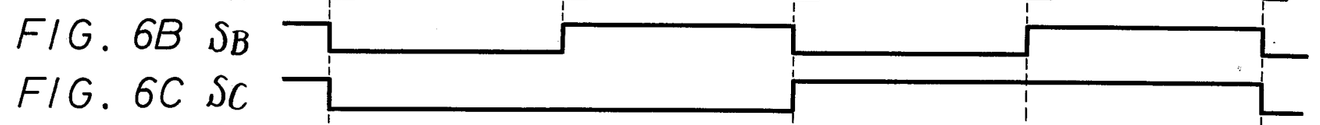

The manner in which the AFC circuit illustrated in FIG. 5 operates now will be described with reference to FIGS. 6A–6I and FIGS. 7A–7C. FIG. 6A illustrates the separated horizontal synchronizing pulses $P_H$ which are supplied to the divide-by-four circuit formed of flip-flop circuits 42 and 43. Flip-flop circuit 42, which may comprise a D-type flip-flop circuit, a J-K flip-flop circuit, or other conventional triggerable flip-flop device, is triggered to change the state thereof in response to the negative transition in each separated horizontal synchronizing pulse. Hence, FIG. 6B represents that signal $S_B$, produced by flip-flop circuit 42, has a frequency equal to one-half the horizontal synchronizing frequency. This signal $S_B$ is supplied to flip-flop circuit 43 whereat the frequency thereof is divided by a factor of two to produce the complementary output signals $S_C$ and $S_D$, shown in FIGS. 6C and 6D, respectively. It is seen that the duration that each of signals $S_C$ and $S_D$ is a binary "1" is equal to two horizontal synchronizing periods. The signal $S_D$, and particularly the binary "1" duration thereof, is supplied as the enabling signal to AND gate 41.

Figures 6D, 6E, 6F:
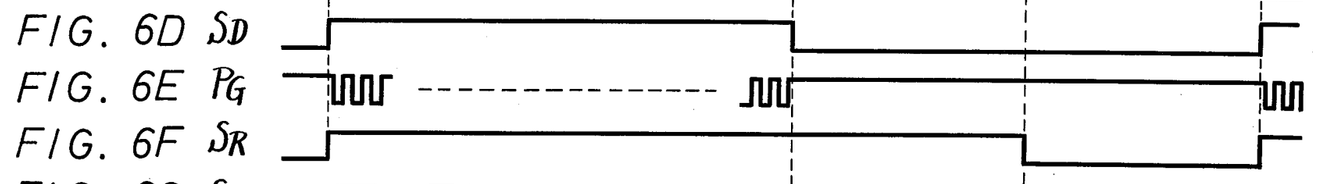
Figures 6G, 6H:
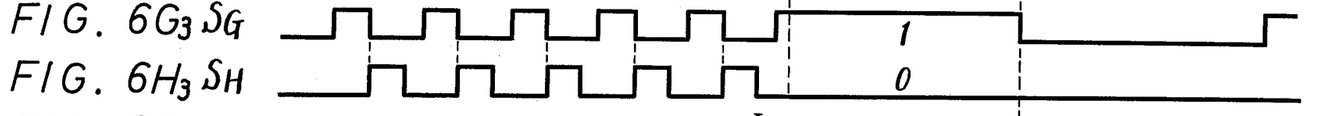
Figures 6G, 6H:
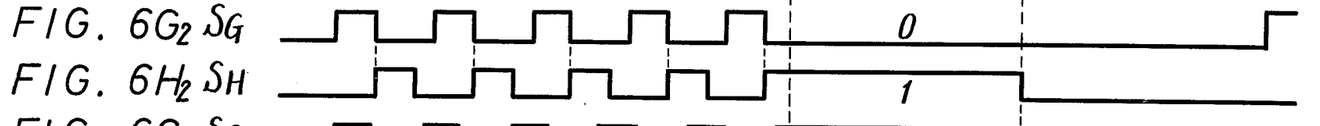
Figures 6G, 6H:
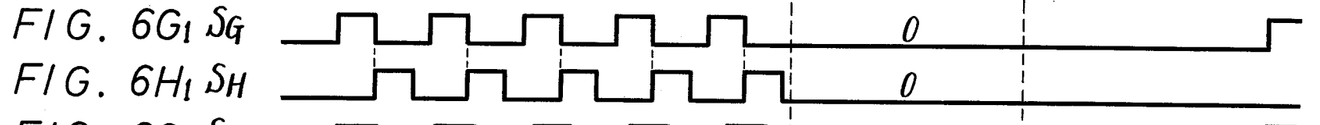

The pulses generated by adjustable oscillator 23 are supplied to AND gate 41 and are gated therethrough during the duration of each enabling signal $S_D$. As shown in FIG. 6E, these gated pulses $P_G$ are supplied to counter 44 for an interval corresponding to two horizontal synchronizing periods. It is appreciated that each period of the pulses $P_G$ corresponds to one cycle of the oscillating signal generated by adjustable oscillator 23. These pulses $P_G$ are counted by counter 44. That is, the count of counter 44 is incremented from zero toward its maximum count of seventy (the cumulative effect of the dividing ratios five, seven and two), and then recycled. Since the frequency of the oscillating signal generated by adjustable oscillator 23 is equal to 175 $f_H$, it is appreciated that 175 pulses $P_G$ are gated through AND gate 41 during a single horizontal synchronizing period. Thus, during two horizontal synchronizing periods, that is, the duration of the enabling signal $S_D$, a total of 350 pulses $P_G$ are supplied to counter 44. Consequently, if the frequency of the horizontal synchronizing signal is equal to $f_H$, and if the frequency of the oscillating signal generated by adjustable oscillator 23 is equal to 175 $f_H$, then, during the duration of the enabling signal $S_D$, counter 44 will be incremented from a count of zero to a count of sixty-nine, and then recycled to be incremented from a count of zero to a count of sixty-nine once again, and so on for a total of five times ($5 \times 70 = 350$). At the termination of the enabling signal $S_D$, that is, at time $t_1$ which concludes the second horizontal synchronizing period, counter 44 will exhibit a count of zero.

If the frequency of the oscillating signal produced by adjustable oscillator 23 is changed by, for example, the APC circuit so as to differ from a frequency of 175 $f_H$, or if, because of time-base errors, the frequency of the horizontal synchronizing signal differs from $f_H$, then either the number of pulses $P_G$ which is supplied to counter 44 during the enabling signal duration $S_D$, or this duration itself, will vary. In either event, it is expected that, at time $t_1$, that is, at the completion of the enabling signal duration, the count attained by counter 44 will differ from a count of zero. If the duration of the enabling signal $S_D$ is reduced, as by an increase in the horizontal synchronizing frequency, the count attained by counter 44 will be less than zero, for example, sixty-nine, sixty-eight, sixty-seven, and so on. Similarly, if the frequency of the oscillating signal generated by adjustable oscillator 23 is reduced, then the count attained by counter 44 at the completion of the enabling signal $S_D$ also will be less than zero. Conversely, if the duration of the enabling signal is increased, as by a decrease in the horizontal synchronizing frequency, then it is expected that the count attained by counter 44 will be greater than zero, for example, this count will be equal to a count of one, two, three, and so on. Similarly, if the frequency of the oscillating signal generated by adjustable oscillator 23 increases so as to be greater than 175 $f_H$, the count attained by counter 44 at the completion of the enabling signal $S_D$ also will be greater than zero. Thus, if the count attained by counter 44 at the completion of the enabling signal $S_D$ is other than zero, then the magnitude of this count (i.e., greater or less than zero) will indicate the direction of the time-base error. Furthermore, the magnitude of the count will indicate whether the time-base error is within the lock-in range of the APC circuit.

It is assumed that when the phase relation between the oscillating signal generated by adjustable oscillator 23 and the reproduced video signal is such that if the horizontal synchronizing frequency is thought of as being fixed at $f_H$, then the lock-in range of the APC circuit will extend from an oscillating signal frequency of 174 $f_H$–176 $f_H$. If the frequency of the oscillating signal is outside this range, that is, less than 174 $f_H$ or greater than 176 $f_H$, then it is assumed that the time-base errors in the reproduced video signal exceed the lock-in range of the APC circuit. At a frequency of 174 $f_H$, a total of 348 pulses $P_G$ are supplied to counter 44 during the enabling pulse interval defined by two horizontal synchronizing periods. This means that counter 44 increments to a count of sixty-nine and then is recycled four successive times, and then during the fifth counting cycle thereof, attains a count of sixty-eight. If the frequency of the oscillating signal generated by adjustable oscillator 23 is equal to 176 $f_H$, then it is appreciated that a total of 352 pulses $P_G$ are supplied to counter 44 during the interval defined by the enabling pulse $S_D$. This means that counter 44 is recycled for five complete counting cycles, and then during a sixth counting cycle increments the count thereof from zero to a count of two. For the purpose of the present invention, it is assumed that the time-base errors in the reproduced video signal are within the lock-in range of the APC circuit if the count of counter 44 at the completion of the enabling pulse $S_D$ is equal to a count of sixty-eight, sixty-nine, zero, one or two. If the count of counter 44 is outside this numerical range, then it is assumed that the time-base errors in the reproduced video signal exceed the lock-in range of the APC circuit.

Figure 7A:
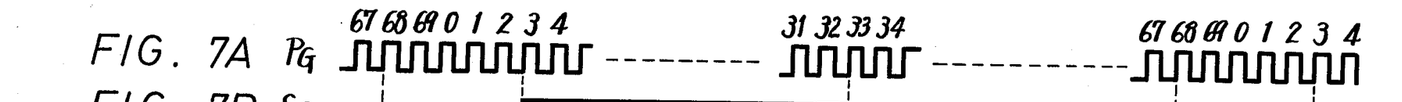
FIGS. 7A–7C are waveform diagrams which are useful in understanding the operation of the logic circuits illustrated in FIG. 5.
Figures 7B, 7C:
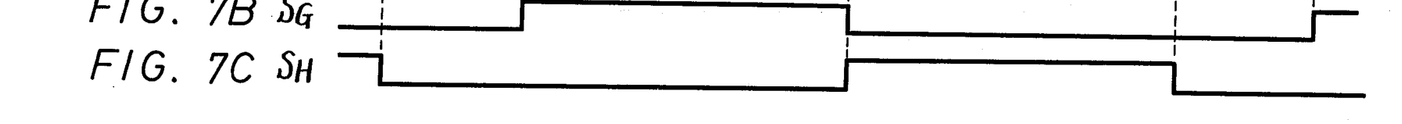

FIG. 7A represents the possible count which can be attained by counter 44, and FIGS. 7B and 7C represent adjustment signals $S_G$ and $S_H$ produced by logic circuits 49 and 50 in response to the counts attained by counter 44. That is, and as shown in FIG. 7B, adjustment signal $S_G$ is a binary "0" when the count of counter 44 is equal to sixty-eight, sixty-nine, zero, one or two, then is changed over to a binary "1" for counts between three and thirty-two, and then is returned to a binary "0" if the count of counter 44 is thirty-three or greater. As shown in FIG. 7C, adjustment signal $S_H$, produced by logic circuit 50, is changed over from a binary "1" to a binary "0" when the count of counter 44 is equal to sixty-eight or greater, this is, is equal to sixty-eight, sixty-nine, zero, one, two, and so on. This adjustment signal is returned to a binary "1" when the count of counter 44 reaches a count of thirty-three. Thus, neither adjustment signal $S_G$ nor adjustment signal $S_H$ is a binary "1" when the count of counter 44 is within its predetermined numerical range sixty-eight, sixty-nine, zero, one or two. That is, an adjustment signal is not produced when the phase relationship between the oscillating signal generated by adjustable oscillator 23 and the time-base errors in the reproduced video signal is within the lock-in range of the APC circuit. However, when these time-base errors exceed the lock-in range, then the count attained by counter 44 is outside its numerical range (sixty-eight—two) so that one or the other of adjustment signals $S_G$ and $S_H$ is produced.

In view of the foregoing, FIG. 6G₁ is a waveform representation of adjustment signal $S_G$, produced during the duration of enabling signal $S_D$, when the time-base errors in the reproduced video signal are within the lock-in range of the APC circuit. It is appreciated that, as oscillator pulses $P_G$ are counted by counter 44, the state of adjustment signal $S_G$ changes between its binary "0" and "1" levels. Thus, from time $t_o$, adjustment signal $S_G$ remains at its binary "0" level when the first two oscillator pulses $P_G$ are counted. When the third oscillator pulse $P_G$ is received to increment the count of counter 44, adjustment signal $S_G$ is changed over to its binary "1" level. This adjustment signal remains at its binary "1" level until the count of counter 44 reaches a count of thirty-two. Then, in response to the next oscillator pulse $P_G$, the count of this counter is incremented to a count of thirty-three, and adjustment signal signal $S_G$ is changed over to a binary "0." As further oscillator pulses $P_G$ are counted, adjustment signal $S_G$ remains at its binary "0" level. It is recalled that, after the sixty-ninth oscillator pulse is counted, counter 44 is recycled so as to resume counting from zero. Hence, the recycling of counter 44 will result ultimately in incrementing its count once again to a count of three. At that time, adjustment signal $S_G$ changes over from its binary "0" level to its binary "1" level, as shown in FIG. $6G_1$. This periodic change-over in adjustment signal $S_G$ continues until the termination of the enabling signal $S_D$ which, in turn, terminates the counting operation of counter 44. At that time, that is, at time $t_1$, the count of counter 44 will be sixty-eight, sixty-nine, zero, one or two because it has been assumed that the frequency of the oscillating pulses produced by adjustable oscillator 23 is within the lock-in range of the APC circuit. Hence, at time $t_1$, adjustment signal $S_G$ is at its binary "0" level.

FIG. $6H_1$ is a waveform representation of adjustment signal $S_H$ throughout the duration of the enabling signal $S_D$, that is, as the count of counter 44 is incremented. It is seen that when the count of counter 44 is incremented from a count of zero to a count of thirty-two, adjustment signal $S_H$ remains at its binary "0" level. In response to the next oscillator pulse $P_G$, counter 44 is incremented to a count of thirty-three and adjustment signal $S_H$ is changed over to its binary "1" level. This binary "1" level is maintained until the count of counter 44 is incremented to a count of sixty-eight. At that time, adjustment signal $S_H$ is changed over to its binary "0" level. Then, as counter 44 continues to recycle, adjustment signal $S_H$ undergoes periodic change overs between its binary "0" and binary "1" levels, as shown in FIG. $6H_1$. At time $t_1$, that is, at the completion of the enabling pulse $S_D$, it is assumed that the count of counter 44 is equal to a count of sixty-eight, sixty-nine, zero, one or two because it has been assumed that the frequency of the oscillating pulses produced by adjustable oscillator 23 is within the lock-in range of the APC circuit. Thus, and as shown in FIG. $6H_1$, at time $t_1$, adjustment signal $S_H$ is at its binary "0" level.

Since the count of counter 44 is neither incremented nor reset between time $t_1$ and time $t_2$, it is appreciated that adjustment signals $S_G$ and $S_H$, produced by logic circuits 49 and 50, respectively, during this interval $t_1$–$t_2$ remain at the levels attained thereby at time $t_1$. This is shown in FIGS. $6G_1$ and $6H_1$ wherein adjustment signals $S_G$ and $S_H$ are shown at their respective binary "0" levels from time $t_1$ to time $t_2$.

Figure 6I:
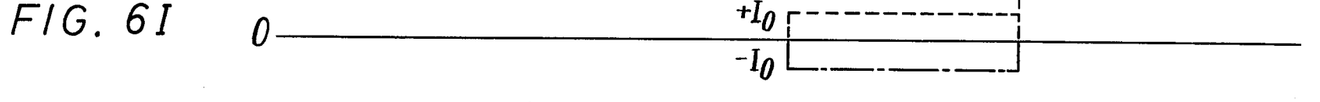

If it is assumed that the oscillating frequency of adjustable oscillator 23 is reduced below the lock-in range of the APC circuit, then adjustment signals $S_G$ and $S_H$ produced during the enabling pulse duration $S_D$ will have the waveforms shown in FIGS. $6G_2$ and $6H_2$, respectively. It is seen that these adjustment signals change over between their binary "1" and binary "0" levels as the count of counter 44 is recycled. However, at time $t_1$, that is, at the completion of the enabling pulse duration $S_D$, it is assumed that the count of counter 44 lies between a count of thirty-three and a count of sixty-seven, corresponding to a frequency of adjustable oscillator 23 which is below the lock-in range of the APC circuit. Accordingly, at time $t_1$, adjustment signal $S_G$ is at its binary "0" level, whereas adjustment signal $S_H$ is at its binary "1" level, as shown in FIGS. $6G_2$ and $6H_2$, respectively. Therefore, in the duration $t_1$–$t_2$ wherein counter 44 is neither incremented nor reset, adjustment signal $S_G$ supplied to transistor 52 is a binary "0," thereby maintaining this transistor non-conductive. However, adjustment signal $S_H$ is a binary "1" to render transistor 53 conductive. At this time, that is, during the duration $t_1$–$t_2$, the complementary output $S_C$ from flip-flop circuit 43 is a binary "1" to energize current source 54. Therefore, current flows through conducting transistor 53 and through current source 54. This current also flows through current mirror circuit 55 which, in turn, supplies an output current $+I_0$ from the output thereof to integrating circuit 56. Consequently, capacitor 57 in integrating circuit 56 is charged to increase the voltage applied through mixing circuit 28 to adjustable oscillator 23. This, in turn, increases the frequency of the adjustable oscillator to return it to the lock-in range of the APC circuit. This charging current $+I_0$ supplied to capacitor 57 when adjustment signal $S_H$ is a binary "1" is shown by the broken line in FIG. 6I.

FIGS. $6G_3$ and $6H_3$ are waveform representations of adjustment signals $S_G$ and $S_H$, respectively, when counter 44 is incremented in response to oscillator pulses in the event that the frequency of adjustable oscillator 23 is above the lock-in range of the APC circuit. It is seen that, as counter 44 recycles, the adjustment signals change over between their respective binary "1" and binary "0" levels. Since it has been assumed that the frequency of adjustable oscillator 23 is above the lock-in range of the APC circuit, more than 352 oscillator pulses $P_G$ are supplied to counter 44 during the enabling pulse duration $S_D$. As shown in FIGS. $6G_3$ and $6H_3$, counter 44 recycles slightly more than five times. Hence, at time $t_1$, that is, at the completion of the enabling pulse duration $S_D$, counter 44 will exhibit a count which lies between a count of three and a count of thirty-two. As shown in FIG. $6G_3$, adjustment signal $S_G$ thus is a binary "1" at time $t_1$. FIG. $6H_3$ indicates that adjustment signal $S_H$ is a binary "0" at this time. During the immediately following duration $t_1$–$t_2$, counter 44 is neither incremented nor reset, and adjustment signals $S_G$ and $S_H$ remain at their binary "1" and binary "0" levels, respectively. Transistor 52 is rendered conductive by the binary "1" level of adjustment signal $S_G$. Accordingly, current $-I_0$ flows therethrough to current source 54, the latter being energized in response to the binary "1" of the complementary output signal $S_C$ produced by flip-flop circuit 43. Since transistor 53 remains non-conductive in response to the binary "0" level of adjustment signal $S_H$, current mirror circuit 55 remains turned OFF. Consequently, the current $-I_0$ flowing through transistor 52 is a discharge current which serves to discharge capacitor 57 in integrating circuit 56. This discharge current is represented by the chain line shown in FIG. 6I. As capacitor 57 is discharged, the voltage thereacross is reduced so as to return the oscillating frequency of adjustable oscillator 23 to the lock-in range of the APC circuit.

It should be seen from the foregoing that counter 44 counts the number of oscillator pulses produced by adjustable oscillator 23 during an interval established by two successive horizontal synchronizing periods. As the frequency of the adjustable oscillator increases above or decreases below the lock-in range of the APC circuit, a count indicative thereof will be stored in counter 44. This count is sensed by logic circuits 49 and 50 to control current converter 51 to supply either a charging or a discharge current to integrating circuit 56. This charging or discharge current modifies the voltage across capacitor 57 so as to correspondingly modify the oscillating frequency of adjustable oscillator 23 to return it to the lock-in range of the APC circuit. The following table sets out representative counts of counter 44, and the corresponding states of adjustment signals $S_G$ and $S_H$ for various frequencies $f_V$ of adjustable oscillator 23.

the D input of the most significant stage 72. The $\overline{Q}$ outputs of stages 71 and 72 both are connected back to the D input of least significant stage 70. As is apparent to one of ordinary skill in the art, successive oscillator pulses $P_G$ supplied to D-type flip-flop circuits 70-72 will increment the count of these flip-flop circuits from a count of zero to a count of five and then will be recycled. Hence, the signal provided at the Q output of the most significant stage 72 will change over between its binary "1" and binary "0" levels at a frequency which is one-fifth the frequency of the oscillator pulses $P_G$.

Count-to-seven stage 46 is comprised of D-type flip-flop circuits 73, 74, 75 and 76, each of these D-type flip-flop circuits being similar to the aforementioned type included in count-to-five counter 45, and each being supplied with the output pulse train $S_{P1}$ produced at the Q output of flip-flop circuit 72 in preceding counter stage 45. This output pulse train $S_{P1}$ is supplied as the clock pulse to the timing, or clock pulse inputs CK of each of the flip-flop circuits included in counter

| $f_V$ | 158 | ... | 173.5 | 174 | 174.5 | 175$f_H$ | 175.5 | 176 | 176.5 | ... | 191.5 |
|---|---|---|---|---|---|---|---|---|---|---|---|
| Counter (44) | 36 | ... | 67 | 68 | 69 | 0 | 1 | 2 | 3 | ... | 35 |
| $S_G$ | "0" | ... | "0" | "0" | "0" | "0" | "0" | "0" | "1" | ... | "1" |
| $S_H$ | "1" | ... | "1" | "0" | "0" | "0" | "0" | "0" | "0" | ... | "0" |

The foregoing table has assumed that the horizontal synchronizing frequency $f_H$, and thus the horizontal synchronizing periods, are constant and that the frequency $f_V$ of adjustable oscillator 23 may change either below or above the lock-in range of the APC circuit. It should be appreciated that this is equivalent to having the time-base errors in the reproduced video signal, and particularly the horizontal synchronizing signal, change below or above the lock-in range of the APC circuit. That is, an increase in the horizontal synchronizing frequency, which is the same as a decrease in the horizontal synchronizing period, is equivalent to a reduction in the oscillating frequency $f_V$ of adjustable oscillator 23. Conversely, a decrease in the horizontal synchronizing frequency, which is the same as an increase in the horizontal synchronizing periods, is equivalent to an increase in the frequency $f_V$ of the adjustable oscillator. The foregoing table thus is applicable to such time-base errors which appear as large changes in the reproduced horizontal synchronizing frequency, as well as to time-base errors which appear as large changes in the frequency $f_V$ of adjustable oscillator 23.

From FIG. 6F, it is seen that reset pulse $S_R$ undergoes a negative transition at time $t_2$. This is because, at this time, the first stage output $S_B$ from flip-flop circuit 42 and the complementary output $S_C$ from flip-flop circuit 43 both are at the binary "1" level. NAND gate 48 thus produces a binary "0" in response thereto, this binary "0" being supplied as the reset pulse $S_R$ to counter stages 45, 46 and 47. Hence, at time $t_2$, the count stored in counter 44 is reset to an initial zero count.

Referring now to FIG. 8, counter 44 is shown in greater detail, and logic circuits 49 and 50 are schematically illustrated. Specifically, count-to-five stage 45, included in counter 44, is comprised of D-type flip-flop circuits 70, 71 and 72, each of these flip-flop circuits including a timing, or clock, pulse input CK connected in common to receive the oscillator pulses $P_G$ gated by AND gate 41. The Q output of the least significant stage 70 is connected to the D input of the next most significant stage 71 whose Q output is, in turn, connected to stage 46. As shown, the Q output of the least significant stage 73 is connected to the D input of the next most significant stage 74 whose Q output is, in turn, connected to the D input of the next most significant stage 45 whose Q output is, in turn, connected to the D input of the next most significant stage 76. The $\overline{Q}$ outputs of stages 75 and 76 are fed back to the D input of the least significant stage 73. It is appreciated that the count of count-to-seven stage 46 is incremented from a count of zero to a count of seven, and then is recycled, in response to the pulse train $S_{P1}$ supplied thereto. The Q output of the least significant stage 73 produces a pulse train $S'_{P2}$ whose frequency is equal to one-seventh the frequency of the pulse train $S_{P1}$. Also, the Q output of the most significant stage 76 produces a pulse train $S_{P2}$ which also has a frequency equal to one-seventh the frequency of pulse train $S_{P1}$. In addition, pulse train $S_{P2}$, although equal in frequency to the pulse train $S'_{P2}$, nevertheless is phase-shifted therefrom, as will be shown below.

Count-to-two stage 47 is comprised merely of a single D-type flip-flop circuit 77 whose timing, or clock pulse input CK is connected to receive pulse train $S_{P2}$ produced by the most significant stage 76 included in count-to-seven counter 46. The Q output of flip-flop circuit 77 produces a pulse train $S_{P3}$ whose frequency is equal to one-half the frequency of the pulse train $S_{P2}$.

It is recalled that logic circuit 49 is adapted to sense when the count included in counter 44 lies between a count of three and thirty-three, inclusive. To this effect, logic circuit 49 is comprised of AND gates 60 and 62, an inverter 61 and an OR gate 63. AND gate 60 includes one input connected to receive pulse train $S'_{P2}$ and another input connected to inverter 61 so as to receive an inverted version of pulse train $S_{P3}$. AND gate 62 includes one input connected to receive pulse train $S_{P2}$ and another input connected to receive pulse train $S_{P3}$. The outputs of AND gates 60 and 62 are connected to OR gate 63, the output from which provides the adjustment signal $S_G$.

Logic circuit 50 is adapted to sense when the count of counter 44 is equal to a count of thirty-three to sixty-seven, inclusive. To this effect, logic circuit 50 includes AND gates 64 and 65, an inverter 66 and an OR gate 67. AND gate 64 includes one input connected to receive the pulse train $S_{P2}$ and another input connected through inverter 61 of logic circuit 49 so as to receive an inverted version of pulse train $S_{P3}$. AND gate 65 includes one input connected to receive the pulse train $S_{P3}$ and another input connected through inverter 66 to receive in inverted version of pulse train $S_{P2}$. The outputs of AND gates 64 and 65 are connected to OR gate 67, the output from which provides the adjustment signal $S_H$.

Figures 9A, 9B, 9C, 9D, 9E, 9F, 9G, 9H, 9I, 9J, 9K:
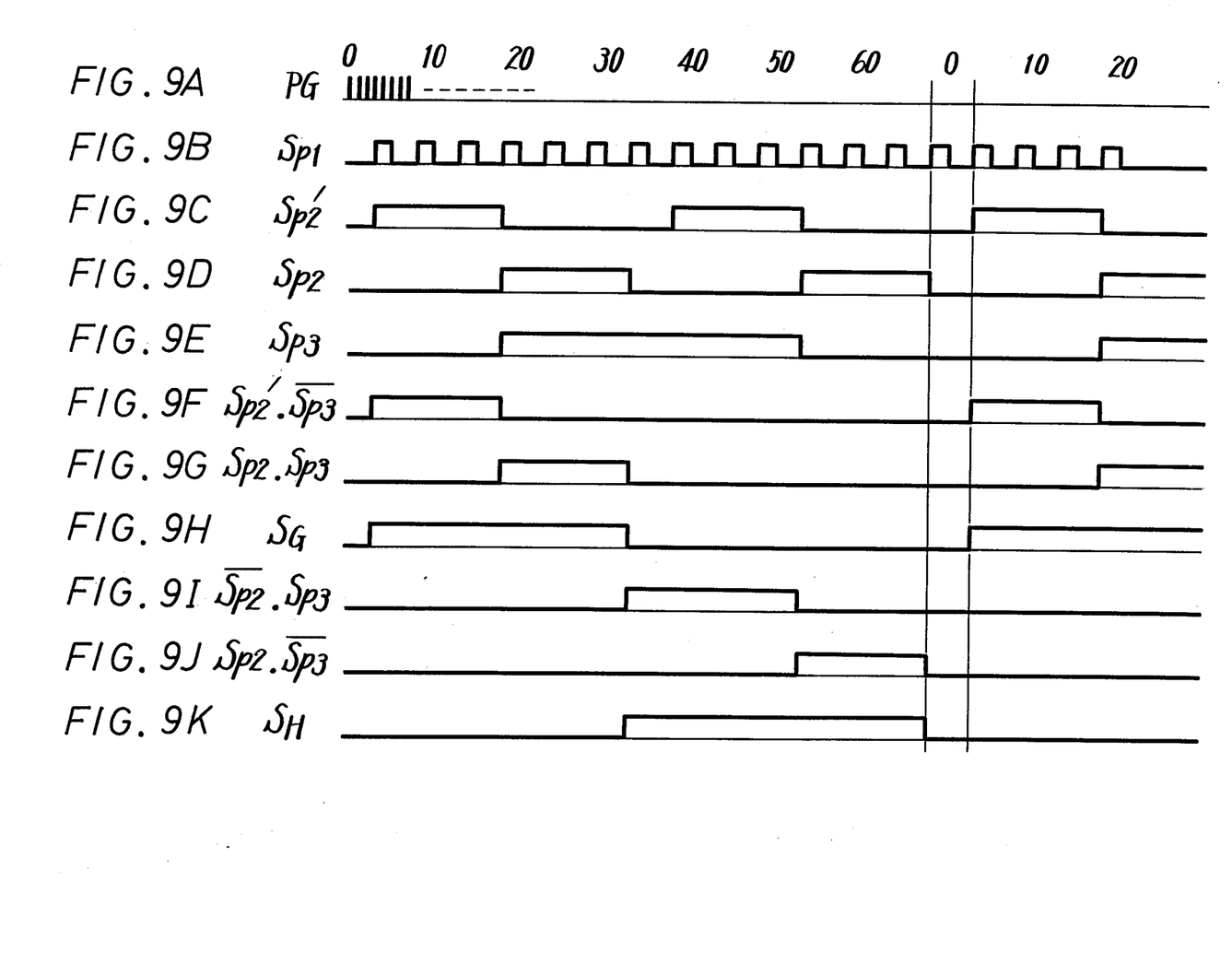
FIGS. 9A–9K are waveform diagrams which are useful in understanding the operation of the circuitry shown in FIG. 8.

The manner in which counter 44 and logic circuits 49 and 50, shown in FIG. 8, cooperate to produce the adjustment signals $S_G$ and $S_H$ now will be described with reference to the waveforms shown in FIGS. 9A–9K. FIG. 9A illustrates the oscillator pulses $P_G$ which are gated to counter 44 by AND gate 41. The scale above FIG. 9A represents that the counter is incremented from a count of zero to a count of sixty-nine and then is recycled once again. FIG. 9B is the pulse train $S_{P1}$ which is produced by the divide-by-five counter 45. It is seen that the frequency of pulse train $S_{P1}$ is one-fifth the frequency of the oscillator pulses $P_G$.

Pulse train $S_{P1}$ is supplied as a clock pulse to count-to-seven counter 46. FIG. 9C illustrates the pulse train $S'_{P2}$ produced by the least significant stage 73 in response to pulse train $S_{P1}$. It is seen that the frequency of pulse train $S'_{P2}$ is equal to one-seventh the frequency of the pulse train $S_{P1}$. FIG. 9D illustrates the pulse train $S_{P2}$ produced by the most significant stage 76 included in the count-to-seven counter 46. It is seen that pulse train $S_{P2}$ is equal in frequency to the pulse train $S'_{P2}$, but is phase-shifted therefrom. FIG. 9E illustrates the pulse train $S_{P3}$ which is produced by dividing the frequency of the pulse train $S_{P2}$ by a factor of two in flip-flop circuit 77.

AND gate 60 is provided with pulse train $S'_{P2}$ and, through inverter 61, with the pulse train $\overline{S}_{P3}$. FIG. 9F illustrates the waveform produced by AND gate 60 in response to these pulse trains supplied thereto. AND gate 62 is supplied with pulse trains $S_{P2}$ and $S_{P3}$. FIG. 9G illustrates the output of AND gate 62 in response to these pulse trains supplied thereto. FIG. 9H illustrates the waveform output produced by OR gate 63 in response to the waveforms supplied thereto by AND gates 60 and 62. Hence, FIG. 9H is a waveform diagram of the adjustment signal $S_G$. It is seen that this adjustment signal undergoes a positive transition in response to the third oscillator pulse $P_G$, and undergoes a negative transition in response to the thirty-third oscillator pulse. This operation is, of course, recycled for each group of seventy oscillator pulses $P_G$ supplied to counter 44.

FIG. 9I represents the waveform produced by AND gate 65 in response to the pulse trains $S_{P3}$ and $\overline{S}_{P2}$ supplied thereto. FIG. 9J illustrates the waveform produced by AND gate 64 in response to the pulse trains $S_{P2}$ and $\overline{S}_{P3}$ supplied thereto. When either of the waveforms shown in FIGS. 9I and 9J is at its binary "1" level, OR gate 67 produces a binary "1" as shown in FIG. 9K. Hence, adjustment signal $S_H$, as shown in FIG. 9K, undergoes a positive transition in response to the thirty-third oscillator pulse $P_G$ supplied to counter 44, and undergoes a negative transition in response to the sixty-eighth oscillator pulse.

From the foregoing, it is seen that the present invention provides an AFC circuit for use in time-base correcting apparatus, which AFC circuit is operative only when the time-base errors are outside the lock-in range of the APC circuit. When such large time-base errors are present, the AFC circuit adjusts the operation of the adjustable oscillator included in the APC circuit so as to bring the time-base errors into the lock-in range of the APC circuit. Of course, in the absence of such large time-base errors, that is, if the time-base errors lie within the lock-in range, then only the APC circuit is operative to eliminate such errors.

In accordance with a more general aspect of the present invention, an APC circuit is controlled to be effective to lock the phase thereof to an input signal even if the initial phase relation between that input signal and the oscillating signal produced by the adjustable oscillator included in the APC circuit is outside the lock-in range. This phase relation is determined by the count attained by counter 44. As described above, if this count indicates that the phase relation between the input signal and the oscillating signal is outside the lock-in range, then the frequency of the oscillating signal is adjusted so as to modify this phase relation and bring it into the lock-in range of the APC circuit.

While the present invention has been particularly shown and described with reference to a preferred embodiment, it should be readily apparent to those of ordinary skill in the art that various changes and modifications in form and details can be made without departing from the spirit and scope of the invention. For example, the interval during which counter 44 is incremented need not be limited solely to two horizontal synchronizing periods. For example, if the oscillating frequency of adjustable oscillator 23 is equal to $350f_H$ (it being understood that frequency divider 24 be capable of dividing the frequency of this oscillating signal by a factor of eight), then counter 44 need be incremented only during a single horizontal synchronizing period. Furthermore, any desirable count N of oscillator pulses $P_G$ can be used to represent the center frequency of adjustable oscillator 23. In this regard, counter 44 need not necessarily be a recycical counter. For example, this counter may be capable of counting to a count of two hundred. If the count thereof at the end of one or more horizontal synchronizing periods is less than 174, then adjustment signal $S_H$ is produced. Conversely, if the count thereof is greater than 176, then adjustment signal $S_G$ is produced. Furthermore, although current converter 51 has been described above as being energized once during each four horizontal synchronizing periods, it should be appreciated that the current converter can be energized at more or less frequent intervals, as desired. For example, if current converter 51 is energized at each successive horizontal synchronizing period, logic circuits 49 and 50 can include flip-flop circuits connected to, for example, the outputs of OR gates 63 and 67 (FIG. 8) to store the respective adjustment signals $S_G$ and $S_H$ for each successive horizontal synchronizing period. Furthermore, logic circuits 49 and 50 can be triggered by, for example, a high frequency sampling pulse at the end of each horizontal synchronizing period, immediately prior to the resetting of counter 44, so as to sense the count attained by the counter during the just-concluded horizontal synchronizing period. This means that counter 44 can have its count incremented by oscillator pulses $P_G$ during each successive horizontal synchronizing period.

It is intended that the appended claims be interpreted as including the foregoing as well as other such modifications and changes.

What is claimed is:

1. In an automatic phase control circuit having a predetermined lock-in range wherein the oscillating signal produced by an adjustable oscillator is used in combination with an input signal to derive a signal whose phase is compared to a reference signal, the phase difference between the derived signal and the reference signal being used to adjust the oscillator so as to minimize said phase difference and lock the phase of said derived signal to that of said reference signal, a method of adjusting said oscillator in the event that the phase relation between said oscillating signal and said input signal is outside said lock-in range comprising the steps of establishing recurrent intervals which vary with time base errors in said input signal; counting the number of cycles of said oscillating signal in each interval; sensing whether said count is within a predetermined range of a predetermined count; and adjusting the oscillating frequency of said oscillator as a function of said count and in a direction to return said count to within said predetermined range.

2. The method of claim 1 wherein the center frequency of said adjustable oscillator is equal to N cycles in each said interval; and wherein said step of counting the number of cycles of said oscillating signal comprises cyclically counting said cycles to a maximum count of n, wherein n is less than N, such that when the frequency of said oscillating signal is equal to said center frequency, said maximum count is attained m times during each interval, wherein $n \times m = N$, when the frequency of said oscillating signals is less than said center frequency, a count of $n-a$ is attained at the end of an interval, and when the frequency of said oscillating signal is greater than said center frequency, a count of a is attained at the end of an interval, a being an integer.

3. The method of claim 2 wherein said step of sensing whether said count is within a predetermined range comprises generating a first signal when said count of a is attained at the end of an interval if a is within a first numerical range; generating a second signal when said count of $n-a$ is attained at the end of an interval if $n-a$ is within a second numerical range; and generating no signal when the count attained at the end of an interval is greater than $n-a$ and less than a so as to be between said first and second numerical ranges.

4. The method of claim 3 wherein said step of adjusting the oscillating frequency of said oscillator comprises reducing said oscillating frequency when said first signal is generated; and increasing said oscillating frequency when said second signal is generated.

5. Apparatus for eliminating time-base errors in at least the chrominance signal of a composite color video signal, comprising:

frequency-converting means for converting the frequency of at least said chrominance signal from an input frequency to a different frequency, said frequency-converting means including adjustable oscillator means for generating an oscillating signal which is used in the frequency conversion of said chrominance signal;

automatic phase control means having a predetermined lock-in range for controlling the phase of said oscillating signal so as to correspondingly control the phase of the frequency-converted chrominance signal and thereby remove time base errors from the chrominance signal;

interval establishing means responsive to the synchronizing signal included in said color video signal for establishing recurrent intervals, the duration of each said interval varying with time base errors in said synchronizing signal;

counting means coupled to said oscillator means for counting the number of cycles of the oscillating signal produced during each interval, the count attained by said counting means at the end of an interval being within a predetermined numerical range when the time-base errors of said chrominance signal are within said lock-in range and said count being outside said numerical range when said time-base errors of said chrominance signal are outside said lock-in range; and adjustment means for adjusting said oscillator means in addition to said automatic phase control means when said count is outside said predetermined range so as to remove said time-base errors which are outside said lock-in range.

6. The apparatus of claim 5 wherein said frequency-converting means comprises said adjustable oscillator means, a reference oscillator for generating a reference signal, first mixer means for mixing said oscillating signal and said reference signal to produce a frequency-converting signal, and second mixer means for mixing said frequency-converting signal and the chrominance signal to produce said frequency-converted chrominance signal.

7. The apparatus of claim 6 wherein said automatic phase control means comprises burst extracting means for extracting a burst signal from said frequency-converted chrominance signal, phase comparator means for comparing the phase of said extracted burst signal and said reference signal to produce a phase control signal as a function of the phase differential therebetween; and means for applying said phase control signal to said adjustable oscillator means to control said oscillating signal for minimizing said phase differential.

8. The apparatus of claim 5 wherein said oscillating signal is provided with N cycles during each interval when said oscillator means operates at the center frequency thereof; and wherein said counting means comprises a recyclical counter whose count is incremented from 0 toward n in response to each cycle of said oscillating signal, n being an integer.

9. The apparatus of claim 8 wherein said counting means further comprises first count detecting means for detecting when the count of said recyclical counter is between $a_1$ and $a_2$, where $0 < a_1 < a_2$, to produce a first adjustment signal; and second count detecting means for detecting when the count of said recyclical counter is between $a_3$ and $a_4$, where $a_2 < a_3 < a_4 < n$, to produce a second adjustment signal; said first and second adjustment signals causing said adjustment means to adjust said oscillator means.

10. The apparatus of claim 9 wherein said adjustment means comprises integrating means for supplying a control voltage to said oscillator means for controlling the frequency thereof; and switch means responsive to said first adjustment signal for discharging said integrating means, and responsive to said second adjustment signal for charging said integrating means.

11. The apparatus of claim 10 wherein said switch means comprises a pair of transistor means having emitter electrodes connected in common, a current source coupled to said common-connected emitter electrodes, means for energizing said current source at the end of each interval, a current-mirror circuit coupled to the collector electrode of one of said transistor means and having an output terminal coupled to said integrating means, and the collector electrode of said other transistor means being coupled to said integrating means; whereby said other transistor means is responsive to said first adjustment signal when said current source is energized to discharge said integrating means, and said one transistor is responsive to said second adjustment signal when said current source is energized to activate said current-mirror circuit to charge said integrating means.

12. The apparatus of claim 11 further comprising reset means for resetting said recyclical counter prior to the start of a succeeding interval and subsequent to the energization of said current source.

13. The apparatus of claim 8 wherein said interval establishing means comprises horizontal synchronizing signal separator means for separating the horizontal synchronizing signal from said color video signal; enabling pulse generating means for generating an enabling pulse of duration equal to a plurality of horizontal synchronizing signal periods to enable the count of said recyclical counter to be incremented during said enabling pulse duration; adjustment pulse generating means for generating an adjustment pulse of duration equal to at least one horizontal synchronizing signal period following said enabling pulse to energize said adjustment means; and reset pulse generating means for generating a reset pulse of duration equal to at least one horizontal synchronizing signal period prior to the generation of the next enabling pulse to reset said recyclical counter.

14. The apparatus of claim 13 wherein said enabling pulse generating means comprises a divide-by-four logic circuit including first and second triggerable flip-flop stages supplied with said separated horizontal synchronizing signal, the second flip-flop stage of said divide-by-four logic circuit having a pair of output terminals producing complementary output signals, one of which constituting said enabling pulse, said adjustment pulse generating means comprising the other of said output terminals whereby the complementary output signal constitutes said adjustment pulse, and said reset pulse generating means comprises gate means responsive to one of said complementary output signals and to an output from said first flip-flop stage to produce said reset pulse.

* * * * *